(12) United States Patent
Villain et al.

(10) Patent No.: US 7,906,739 B2
(45) Date of Patent: Mar. 15, 2011

(54) ARRANGEMENT FOR SURFACE MOUNTING AN ELECTRICAL COMPONENT BY SOLDERING, AND ELECTRICAL COMPONENT FOR SUCH AN ARRANGEMENT

(75) Inventors: Jean-Christophe Villain, Dole (FR); Michel Cour, Sampans (FR)

(73) Assignee: CoActive Technologies, LLC, Newton, MA (US)

( * ) Notice: Subject to any disclaimer, the term of this patent is extended or adjusted under 35 U.S.C. 154(b) by 302 days.

(21) Appl. No.: 11/948,507

(22) Filed: Nov. 30, 2007

(65) Prior Publication Data

US 2008/0128255 A1    Jun. 5, 2008

(30) Foreign Application Priority Data

Dec. 1, 2006   (FR) ...................................... 06 55260

(51) Int. Cl.
*H01H 9/00* (2006.01)
(52) U.S. Cl. ........................................ 200/292; 200/406
(58) Field of Classification Search .................. 200/292, 200/406
See application file for complete search history.

(56) References Cited

U.S. PATENT DOCUMENTS

| 4,484,042 | A | | 11/1984 | Matsui |
| 4,803,321 | A | | 2/1989 | Lefebvre |
| 4,913,285 | A | * | 4/1990 | Tsutsumi et al. ............. 200/306 |
| 5,315,070 | A | | 5/1994 | Maiwald |
| 5,962,827 | A | * | 10/1999 | Zdanys, Jr. ................. 200/302.1 |
| 6,753,793 | B1 | * | 6/2004 | Kako et al. ...................... 341/22 |
| 7,057,128 | B1 | | 6/2006 | Oyagi et al. |
| 7,541,552 | B2 | * | 6/2009 | Su ................................ 200/294 |
| 2005/0248031 | A1 | | 11/2005 | Johnson |

FOREIGN PATENT DOCUMENTS

WO        97/31383 A    8/1997

* cited by examiner

*Primary Examiner* — Renee Luebke
*Assistant Examiner* — Lheiren Mae A Caroc
(74) *Attorney, Agent, or Firm* — Pepper Hamilton LLP

(57) ABSTRACT

An arrangement may include a substrate and an electrical component. The electrical component may include a base made of an insulating material and a plurality of connection terminals. Each connection terminal is connected to a corresponding connection pad of the substrate by means of a spot of solder paste. The arrangement may further include a block interposed between the substrate and the base of the electrical component. The block may be located substantially on the axis of application of a force for actuating the electrical component and may be designed to inhibit deformation of the base. The block may include a spot of solder paste soldered to an associated conducting pad on the substrate.

7 Claims, 4 Drawing Sheets

ARRANGEMENT FOR SURFACE MOUNTING AN ELECTRICAL COMPONENT BY SOLDERING, AND ELECTRICAL COMPONENT FOR SUCH AN ARRANGEMENT

CROSS-REFERENCE TO RELATED APPLICATION

This application claims the benefit of priority to French Patent Application No. 0655260 filed Dec. 1, 2006, which is hereby incorporated by reference in its entirety.
Not Applicable

BACKGROUND

The risk of damaging a plastic component, such as an electrical switch, is greater when the component is very small because the thickness of the material plastic is typically very thin. Accordingly, the component is more likely to be subjected to permanent plastic deformation. Such deformation is generally impermissible for components because it renders the component unusable or modifies its operating characteristics unacceptably.

U.S. Pat. No. 4,803,321 describes an electrical switch comprising a base made of insulating plastic located on the upper face of a printed circuit board. The electrical connection terminals of the switch that connect the switch to the conducting tracks of the printed circuit hoard can be inserted into holes in the printed circuit board. To avoid excessively large deformation of the insulating base when a vertical actuation force F is applied to the push-button, the central part of the base includes a foot, molded with the base, which extends vertically as far as the upper face of the printed circuit board.

A component designed in this manner has the drawback of increasing the total height of the component. Moreover, such a component is not suitable for surface mounting by reflow soldering because the component "rises" by a variable amount during soldering. The amount by which the component rises can be critical and impermissible for a very thin component.

SUMMARY

In an embodiment, a component may include a block interposed vertically between the upper face of the substrate and a facing portion of the lower face of the base of the component. The block may be located substantially in line with the axis of application of the force in order to avoid deformation of the base. The block may include a spot of solder paste designed to be soldered to a conducting pad associated with the upper face of the substrate.

As such, the embodiment may be beneficial for surface mounting by soldering by producing a block forming a spacer between the lower face of the base and the upper face of the printed circuit board. The block may include solder paste.

In an embodiment, a component for an arrangement may be further provided. A facing portion of the lower face of the base of the component may be a conducting mount that may be soldered to a block. In an embodiment, the portion of the lower face of the base may comprise an insulating material and may be shaped to enable cooperation with the block. In an embodiment, the portion of the lower face of the base may include a housing that can accommodate the upper portion of the block. In an embodiment, the portion of the lower face of the bases may include a point that can be accommodated in the upper portion of the block.

In an embodiment, the component may be an electrical switch including the base, which defines a cavity open at the top, at least one central fixed contact and at least one lateral fixed contact, and a generally dome-shaped trip member received in the cavity. In an embodiments the fixed contacts may be placed in the cavity. In an embodiment, the periphery of the trip member may be in electrical contact with the lateral fixed contact. The trip member may be elastically deformable in order to establish an electrical connection between the two fixed contacts when subjected to an actuation force. In an embodiment, the base may be rectangularly shaped and may include four connection terminals placed at the corners of the base.

DETAILED DESCRIPTION

In the following description, identical, analogous or similar elements will be denoted by the same references. Without being restricting, and for the purpose of making it easier to understand the description and the claims, the terms "vertical," "horizontal," "upper," "lower." etc. will be used with reference to the vertical axis V of the figures, which forms part of the orthogonal coordinate system L, V, T indicated in the figures, solely by convention and without any reference to the Earth's gravity.

Figure 1:
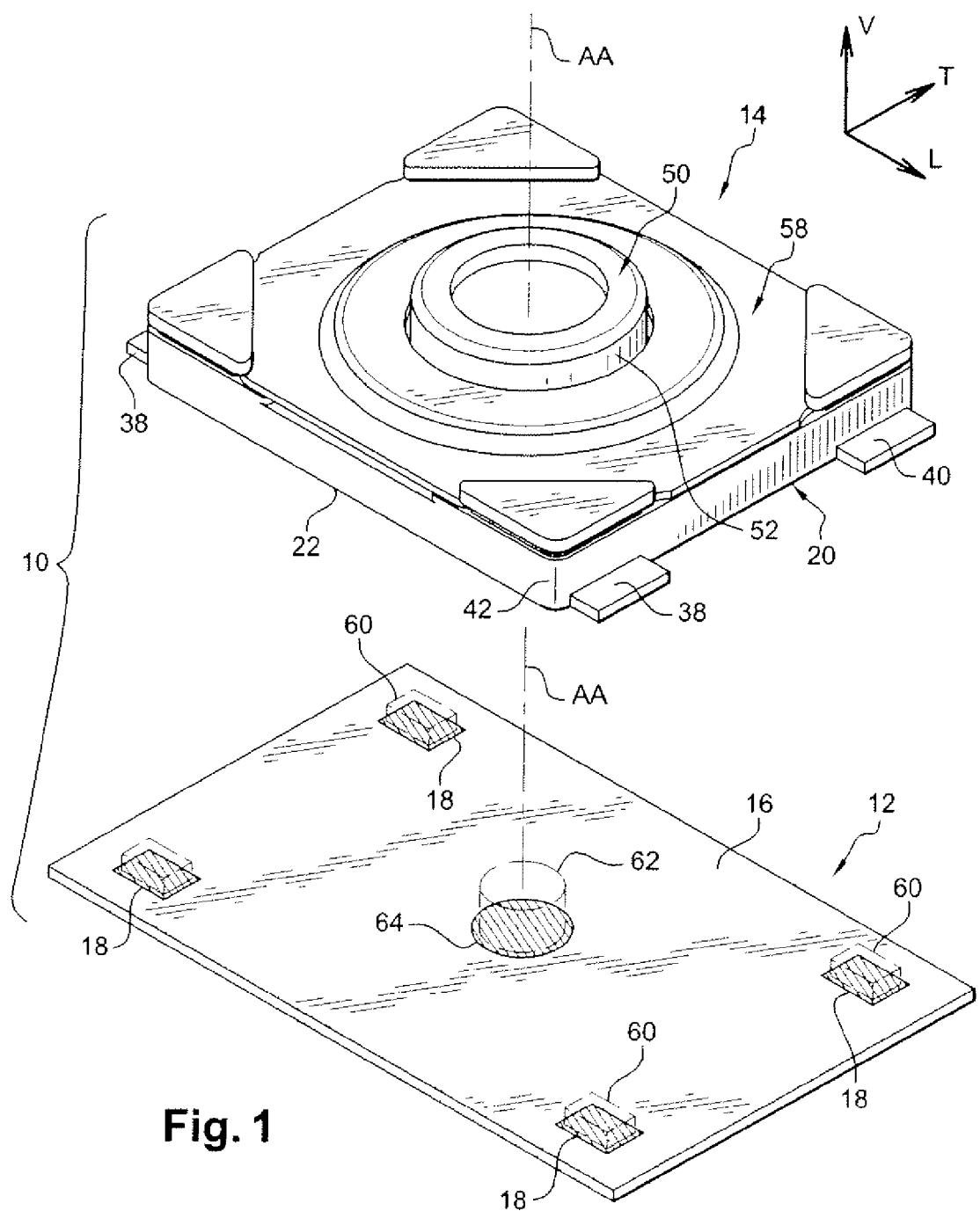
FIG. 1 depicts an exploded perspective schematic view of an arrangement comprising a printed circuit board and an electrical switch according to an embodiment.

FIG. 1 depicts an arrangement 10 including a substrate 12, such as a printed circuit board, and an electrical component 14, such as an electrical switch. The electrical switch 14 may be surface mounted on and fastened to an upper face 16 of the printed circuit board 12 by, for example, a soldering process. The upper face 16 may include a plurality of conducting connection pads. In an embodiment, four conducting connection pads 18 may be placed at respective corners of a rectangle. In an embodiment, each pad 18 may have a rectangular outline. In an embodiment, each connection pad 18 may be soldered to a corresponding connection terminal of the electrical switch 14.

The electrical switch 14 may have a lower base 20 shaped as a substantially rectangular plate. The lower base 20 may be produced by molding an insulating material, such as plastic. In an embodiment, the lower base 20 may be bounded by a lower face 22 and by an upper face 24. In an embodiment, the insulating base 20 may include a central cavity 26 that may be substantially cylindrical. In an embodiment, the central cavity 26 may be open at the top and bounded by a substantially cylindrical lateral wall 28 and a horizontal bottom wall 30 that is parallel to the lower face 22.

Figure 2:
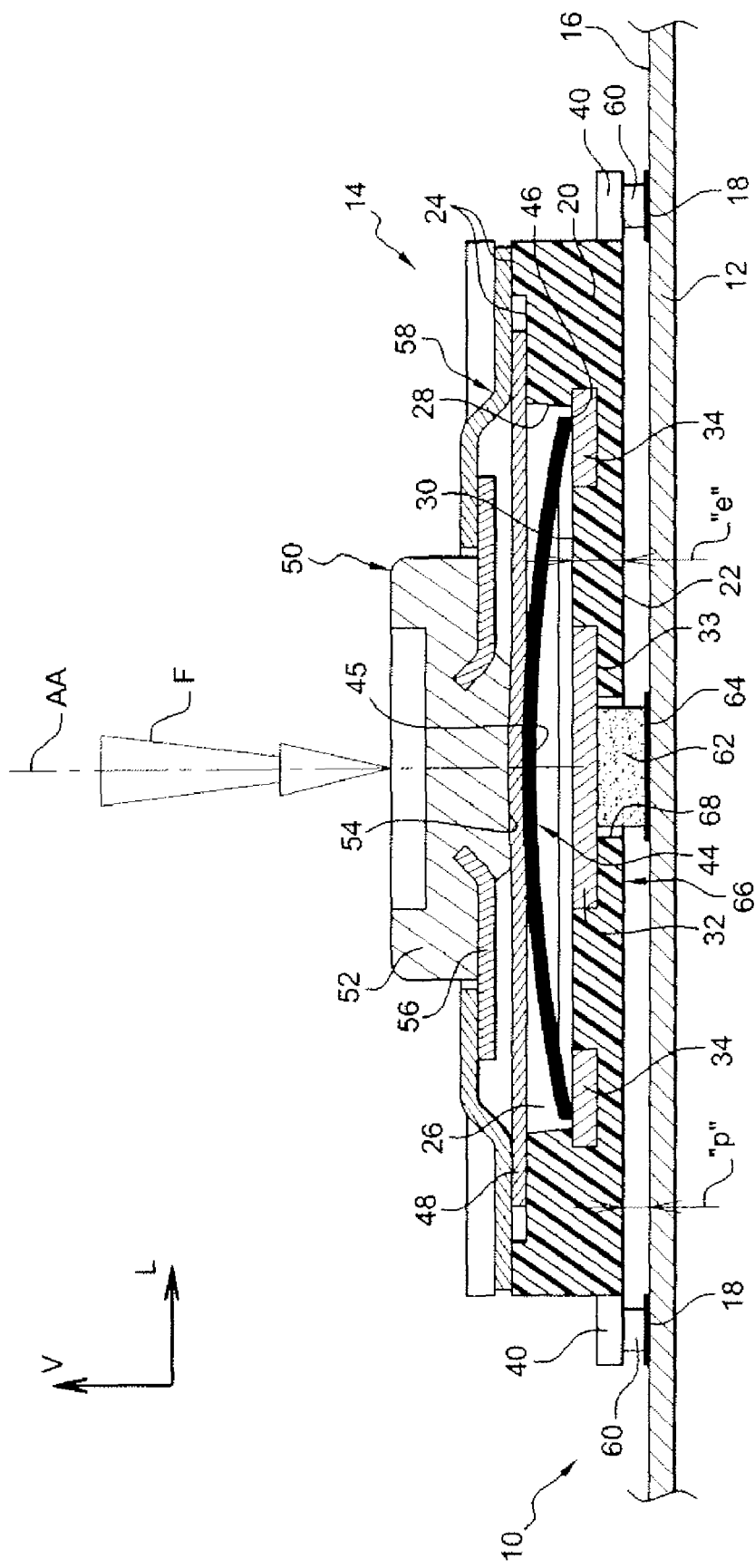
FIG. 2 depicts a sectional view in a vertical mid-plane of the electrical switch of FIG. 1 according to an embodiment.
Figure 3:
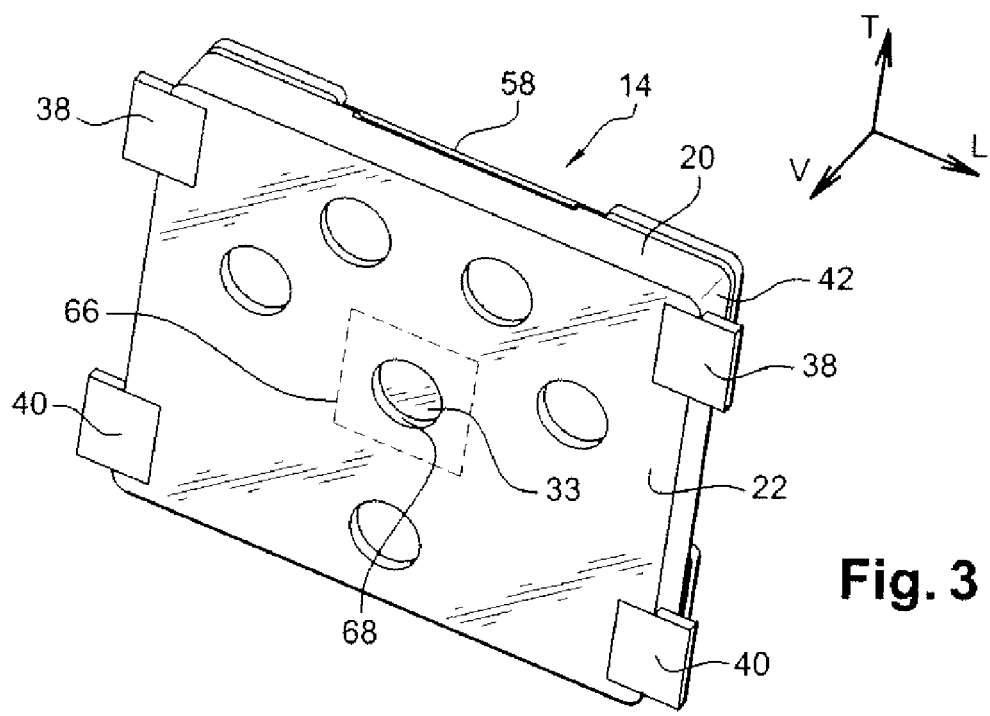
FIG. 3 depicts a perspective view from below the electrical switch shown in FIG. 1.
Figure 4:
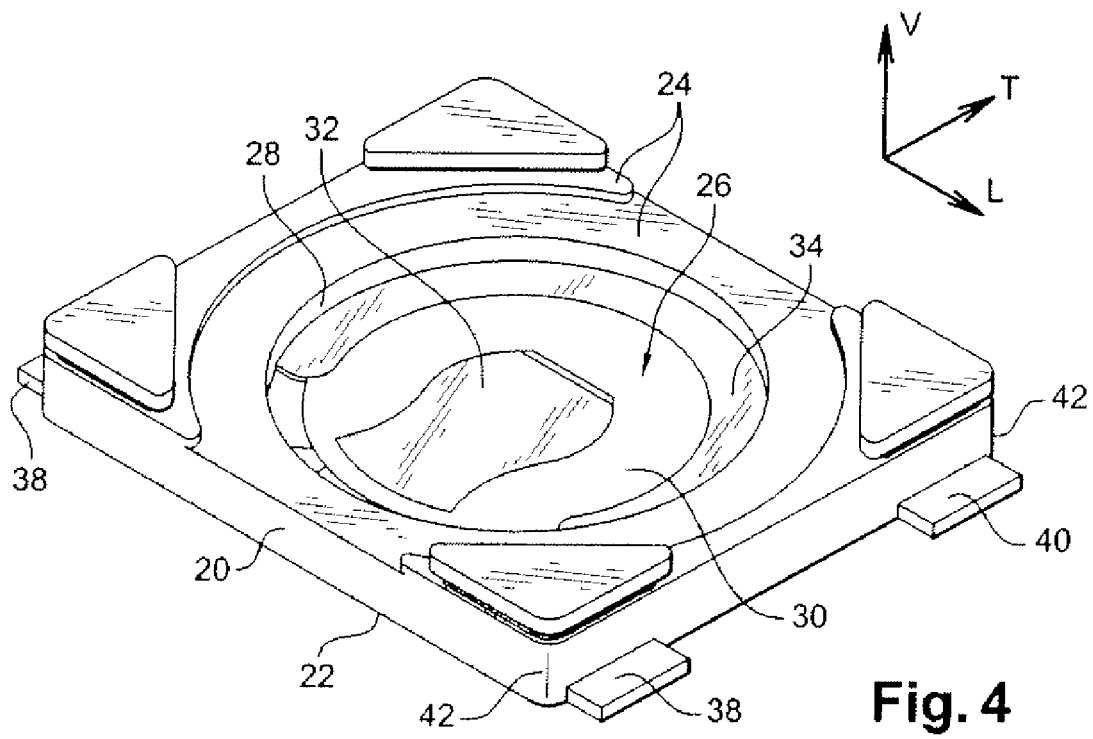
FIG. 4 depicts a perspective view from above the base of the electrical switch having fixed contacts and connection terminals according to an embodiment.

The bottom wall 30 of the central cavity 26 may include a central insert 32 constituting a fixed central electrical contact and a peripheral ring 34 constituting a fixed lateral electrical contact. These fixed electrical contacts 32, 34 may be disposed such that the upper contact faces of the fixed electrical contacts are parallel and flush with the bottom wall 30 of the central cavity 26, as depicted in FIG. 2.

Figure 5:
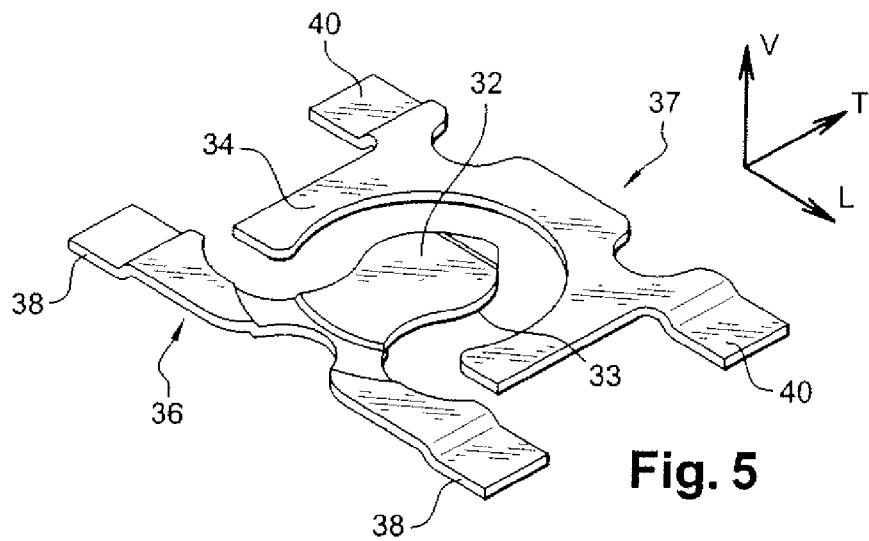
FIG. 5 depicts a perspective view from above the fixed contacts above which the base is overmolded.

As depicted in FIG. 5, the fixed central electrical contact 32 may form a first part of a cut metal contact plate 36 that includes two connection terminals 38. Likewise, the fixed lateral electrical contact 34 may form a second part of a cut metal contact plate 37 that includes two connection terminals 40.

After the base 20 has been overmolded to the plates 36 and 37, the four connection terminals, in the form of two pairs of terminals 38 and 40, respectively, may be placed substantially at corresponding corners 42 of the base 20. As shown in FIG. 2, the horizontal lower face of each terminal 38, 40 may be substantially flush with the plane of the lower face 22 of the base 20 after overmolding.

The electrical switch 14 may further include a central trip member 44 depicted as a circular dome that establishes an electrical switching channel between fixed central electrical contact 32 and fixed lateral electrical contact 34. The central trip member 44 may rest on the upper face of the fixed lateral electrical contact 34. The central part of the central trip member 44 may extend to come into electrical contact with the fixed central electrical contact 32 in order to establish the electrical switching channel.

A sealing film 48 may be used to close off the central cavity 26 and the central trip member 44. The state of the trip member 44 may be changed from a resting position to an engaged position using an actuation member 50. As shown in FIG. 2, electrical switch 14 may be a normally-open switch, and the actuation member 50 may be a central push-button. However, alternate switches and actuation members may be used within the scope of this disclosure.

The actuation member 50 may have a central body 52 bounded by an actuation face 54, which may act on the central part 45 of the trip member 44. For example, the central body 52 may comprise plastic overmolded on a strip of a conductive material, such as copper or aluminum. The body 52 may be overmolded onto a retaining plate 56, allowing the actuation member 50 to be held and retained in relation to the base 20 by means of an upper closure plate 58 having, for example, a substantially rectangular shape. In an embodiment, the upper closure plate 58 may be fastened to the base 20 at the corners of the plate.

An actuation force F may be exerted on the actuation member 50 to engage the trip member 44. The force may generally be applied vertically along a central vertical axis A-A of the switch 14. The central vertical axis A-A may substantially correspond to the central axis of the trip member 44. When the force F is applied, the trip member 44 may change state and establish the switching channel. The actuation member 50 may apply the force F to the central part of the insulating base 20. In an embodiment, the base may have a relatively small thickness "e" corresponding to the distance between faces 22 and 30.

The switch 14, including its connection terminals 40, may be an electrical component configured to be surface mounted on the upper face 16 of the printed circuit board 12 by soldering. Each connection terminal 38, 40 may be electrically connected or joined to a conducting connection plate 18 of the printed circuit board 12 via a block (or spot) 60 of solder paste.

Reflow soldering may be performed to form an electrical connection and to fasten the electrical component (i.e., the switch 14) to the upper face 16 of the printed circuit board 12 using the spots 60 of solder paste. In an embodiment, four connection terminals 38, 40 may be used to ensure proper fastening and balancing of the component 14 after soldering.

As illustrated in FIG. 2, a vertical gap "p" may exist between the lower face 22 of the base 20 and the upper face 16 of the printed circuit board 12. The vertical gap may result from the use of the surface soldering technique. For a base 20 having a substantially small central base thickness "e," applying the actuation force F may lead to a temporary and/or permanent deformation of the base as the base flexes in its central part until it contacts the upper face 16 of the printed circuit board 12.

To inhibit such deformation, the arrangement 10 may include a block 62 forming a spacer stay that is interposed vertically between the upper face 16 of the printed circuit board 12 and a facing portion of the lower face 22 of the base 20. The block 62 may be located substantially in line with the axis A-A defining the application of the actuation force F in order to prevent the base from deforming in its central part. The block 62 may be formed using, for example, a spot of solder paste that is soldered during a reflow soldering operation to an associated additional connection pad 64 on the upper face 16 of the printed circuit board 12. As such, the block 62 may be advantageously and simply formed and may be positioned on the associated connection pad 64 as a result of reflow soldering to cooperate with a portion 66, such as a central portion, of the tower face 22.

In an embodiment, the base 20 may include, in the central portion 66, a cylindrical recess 68 that supports a horizontal facing portion of the lower face 33 of the central electrical contact 32. In an embodiment, the recess 68 may be produced during the overmolding operation by means of a mold ejector that interacts with the face 33. In such an embodiment, the block 62 of solder paste may be soldered to the connection pad 64 and to the fixed electrical contact 32. The presence of the block 62 may mechanically transmit the actuation force F directly to the printed circuit board 12 without causing the base 20 to substantially deform.

Figures 6, 7:
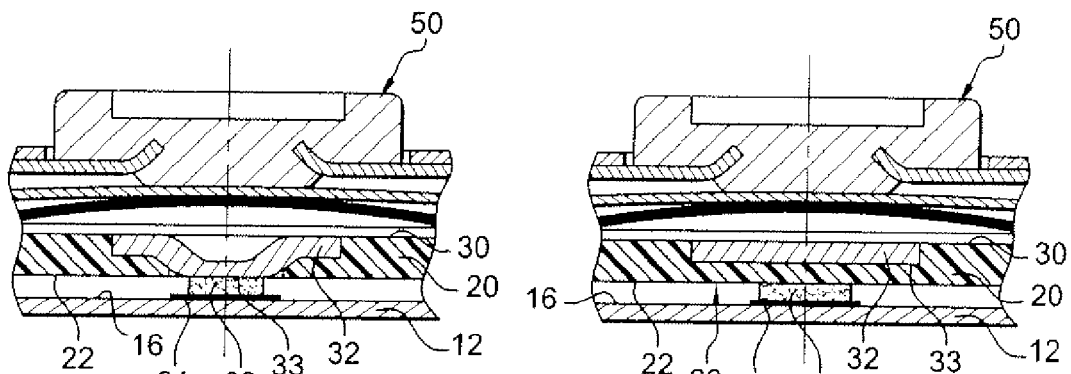
FIGS. 6-9 depict views of alternative arrangements comprising a printed circuit board and an electrical switch according to embodiments.

FIG. 6 depicts an alternative embodiment of an arrangement including an electrical switch and a printed circuit board. As shown in FIG. 6, the central insert constituting the fixed contact 32 may project vertically downwards so that its lower face 33 is substantially flush with the lower face 22 of the base 20. The recess 68 may thus provide access to a conducting mount 33 belonging to the fixed central contact 32 to which the block 62 may be soldered. However, the conducting mount 33 for soldering the upper portion of the block 62 may not necessarily form part of one of the electrical contacts of the switch 14.

FIG. 7 depicts another alternative embodiment of an arrangement including an electrical switch and a printed circuit board. As shown in FIG. 7, the central portion 66 of the lower face 22 of the base 20 may include a portion made of insulating material. In such an embodiment, the block 62 may be soldered only to the connection pad 64 of the printed circuit board 12.

Figures 8, 9:
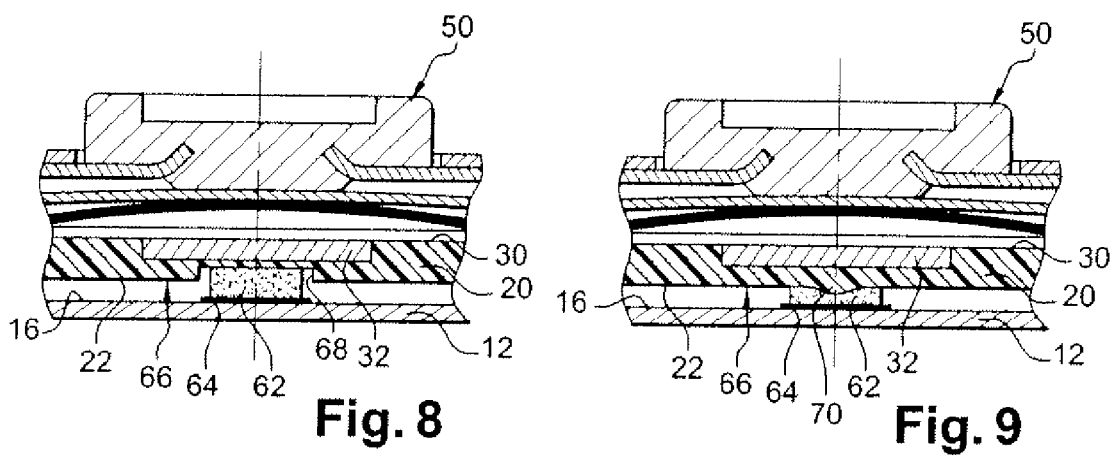

FIG. 8 depicts another alternative embodiment of an arrangement including an electrical switch and a printed circuit board. As shown in FIG. 8, the central portion 66 may be made of an insulating material shaped with a recess 68 that cooperates with the upper portion of the block 62. In such an embodiment, the recess 68 may help to produce the block 62 during a reflow soldering operation by containing the solder paste within the corresponding region.

FIG. 9 depicts yet another alternative embodiment of an arrangement including an electrical switch and a printed circuit board. As shown in FIG. 9, the central part 66 made of an insulating material having a tip 70 that projects downwards. In such an embodiment, the tip 70 may be accommodated in the upper portion of the block 62.

Without departing from the scope of the disclosed embodiments, each arrangement of a discrete component on the upper face of a substrate may employ several spots of solder paste which are arranged, for example, in a ring beneath the central part of the insulating base around the vertical general axis of application of the actuation force and in particular according to the magnitude of the forces applied to the component and/or the longitudinal and transverse dimensions of the base relative to its thickness. All such embodiments and related embodiments are considered to be within the scope of the present disclosure.

What is claimed is:

1. A device comprising:
    a substrate comprising an upper face comprising a plurality of conducting connection pads;
    an electrical component comprising:
        a base comprising insulating material bounded by a lower face extending opposite to a portion of the upper face of the substrate,
        an electrical switch wherein the base defines a cavity, wherein the cavity is open on an upper face of the base, wherein the electrical switch further comprises:
            at least one central fixed contact, wherein each central fixed contact is disposed in the cavity,
            at least one lateral fixed contact, wherein each lateral fixed contact is disposed in the cavity, and
            a generally dome-shaped trip member received in the cavity and the periphery of the base, wherein the trip member is in electrical contact with the at least one lateral fixed contact, wherein the trip member is configured to be elastically deformable in order to establish an electrical connection between the at least one central fixed contact and the at least one lateral fixed contact when the member is subjected to an actuation force; and
        a plurality of connection terminals arranged on a periphery of the base, wherein each connection terminal is electrically connected to a corresponding conducting connection pad of the upper face of the substrate using a spot of solder paste,
    wherein the electrical component is configured to be subjected to an actuation force applied along a direction generally orthogonal to the lower face of the base; and
    a block interposed vertically between the upper face of the substrate and a facing portion of the lower face of the base of the electrical component, wherein the block is located substantially in line with an axis of application of the actuation force, wherein the block is configured to inhibit deformation of the base, wherein the block comprises a spot of solder paste soldered to a conducting pad associated with the upper face of the substrate.

2. The device of claim 1, wherein the facing portion of the lower face of the base of the electrical component comprises a conducting mount configured to be soldered to the block.

3. The device of claim 1, wherein the facing portion of the lower face of the base comprises insulating material.

4. The device of claim 1, wherein the facing portion of the lower face of the base is shaped to cooperate with the block.

5. The device of claim 4, wherein the facing portion of the lower face of the base includes a central body that accommodates an upper portion of the block.

6. The device of claim 4, wherein the facing portion of the lower face of the base includes a point configured to be accommodated in an upper portion of the block.

7. The device of claim 1, wherein the base is rectangularly shaped, wherein the base further comprises a connection terminal at each corner of the base.

* * * * *